US012757560B2

(12) United States Patent
Chen et al.

(10) Patent No.: US 12,757,560 B2
(45) Date of Patent: Oct. 6, 2026

(54) PEROVSKITE SOLAR CELL AND FABRICATION METHOD THEREOF

(71) Applicant: CONTEMPORARY AMPEREX TECHNOLOGY (HONG KONG) LIMITED, Hong Kong (CN)

(72) Inventors: Changsong Chen, Ningde (CN); Zhaohui Liu, Ningde (CN); Weile Lin, Ningde (CN); Xiangling Lin, Ningde (CN); Weifeng Liang, Ningde (CN); Bao Tu, Ningde (CN); Guodong Chen, Ningde (CN); Yongsheng Guo, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 459 days.

(21) Appl. No.: 18/224,074

(22) Filed: Jul. 20, 2023

(65) Prior Publication Data

US 2023/0371290 A1 Nov. 16, 2023

Related U.S. Application Data

(63) Continuation of application No. PCT/CN2022/092191, filed on May 11, 2022.

(51) Int. Cl.
*H10K 30/40* (2023.01)
*H10K 30/85* (2023.01)
(Continued)

(52) U.S. Cl.
CPC ............ *H10K 30/40* (2023.02); *H10K 30/85* (2023.02); *H10K 30/86* (2023.02); *H10K 71/15* (2023.02);
(Continued)

(58) Field of Classification Search
CPC ........ H10K 30/40; H10K 30/85; H10K 30/86; H10K 71/40; H10K 2101/30; H10K 2101/40; H10K 85/50; Y02E 10/549
See application file for complete search history.

(56) References Cited

U.S. PATENT DOCUMENTS

2020/0013974 A1* 1/2020 Fukumoto ................ C07F 7/24
2020/0105481 A1 4/2020 Bawendi et al.
(Continued)

FOREIGN PATENT DOCUMENTS

CN 105742504 A 7/2016
CN 106165137 A 11/2016
(Continued)

OTHER PUBLICATIONS

Xu, Alex Fan et al: "Promoting Thermodynamic and Kinetic stabilities of FA-based Perovskite by an in Situ Bilayer Structure", Nano Letters, vol. 20, No. 5, Apr. 30, 2020, pp. 3864-3871, XP93143797.

(Continued)

*Primary Examiner* — David Vu
*Assistant Examiner* — Brandon C Fox
(74) *Attorney, Agent, or Firm* — XSENSUS LLP

(57) ABSTRACT

This application provides a perovskite solar cell structurally including a transparent electrode, an electron transport layer, a perovskite layer, a hole transport layer and a second electrode in sequence, where the perovskite layer may include a main perovskite layer and a one-dimensional perovskite coating layer covering surface and periphery of the main perovskite layer, where the one-dimensional perovskite coating layer may include: a first overlay layer disposed between the main perovskite layer and the electron transport layer; and a second overlay layer disposed between the main perovskite layer and the hole transport layer.

19 Claims, 1 Drawing Sheet

(51) Int. Cl.

| | |
|---|---|
| ***H10K 30/86*** | (2023.01) |
| ***H10K 71/15*** | (2023.01) |
| ***H10K 71/40*** | (2023.01) |
| ***H10K 71/60*** | (2023.01) |
| ***H10K 85/50*** | (2023.01) |
| ***H10K 101/30*** | (2023.01) |
| *H10K 101/40* | (2023.01) |

(52) U.S. Cl.
CPC ............. *H10K 71/40* (2023.02); *H10K 71/60* (2023.02); *H10K 85/50* (2023.02); *H10K 2101/30* (2023.02); *H10K 2101/40* (2023.02); *Y02E 10/549* (2013.01)

(56) References Cited

U.S. PATENT DOCUMENTS

| | | | | |
|---|---|---|---|---|
| 2022/0231242 | A1* | 7/2022 | Yan | H10K 71/12 |
| 2023/0320109 | A1* | 10/2023 | Liang | H10K 30/85<br>136/263 |
| 2023/0403869 | A1* | 12/2023 | Chen | H10K 30/50 |

FOREIGN PATENT DOCUMENTS

| | | | | |
|---|---|---|---|---|
| CN | 109148688 A | | 1/2019 | |
| CN | 109786564 A | | 5/2019 | |
| CN | 110392940 A | | 10/2019 | |
| CN | 111640870 A | | 9/2020 | |
| CN | 113224239 A | * | 8/2021 | H10K 30/88 |
| CN | 113838981 A | | 12/2021 | |
| EP | 2924755 A2 | | 9/2015 | |
| WO | WO-2019106370 A1 | * | 6/2019 | H10K 85/50 |

OTHER PUBLICATIONS

Yang, Ning et al: "An in situ cross-linked 1D/3D perovskite heterostructure improves the stability of hybrid perovskite solar cells for over 3000 h operation", Energy & Environmental Science, vol. 13, No. 11, Sep. 28, 2020, pp. 4344-4352, XP93143799.

Xu, Alex Fan et al: "Supporting Information: Promoting Thermodynamic and Kinetic stabilities of FA-based perovskite by in-situ bilayer structure", Apr. 30, 2020, XP093143929.

Kai, Zou et al: "Pyridine Derivatives' Surface Passivation Enables Efficient and Stable Carbon-Based Perovskite Solar Cells", ACS Materials Letters, vol. 4, No. 6, May 6, 2022, pp. 1101-1111, XP093144534.

Supplementary European Search Report issued Apr. 10, 2024 in European Patent Application No. 22924582.4.

International Search Report and Written Opinion mailed on Jan. 18, 2023, received for PCT Application PCT/CN2022/092191, filed on May 11, 2022, 15 pages including English Translation.

The First Office Action mailed Jun. 17, 2026, in Chinese Application No. 202280056379.0, 14 pages including English translation.

Guang-Lin Wang et al., "Research Progress of Preparing Full-coverage Organic-inorganic Perovskite Film by One-step Solution Method", Mining & Metallurgy, vol. 27, No. 1, published on Feb. 25, 2018, total 4 pages including English abstract.

Wei-Li Fan et al., "Preparation and performance of high-efficient hole-transport-material-free carbon based perovskite solar cells", Acta Phys. Sin., vol. 67, No. 22, published on Nov. 6, 2018, total 9 pages including English abstract.

Communication pursuant to Article 94(3) EPC mailed Apr. 13, 2026, in European Application No. 22924582.4, 5 pages.

* cited by examiner

PEROVSKITE SOLAR CELL AND FABRICATION METHOD THEREOF

CROSS-REFERENCE TO RELATED APPLICATION

The present application is a continuation of International Application No. PCT/CN2022/092191, filed May 11, 2022, which is incorporated herein by reference in its entirety.

TECHNICAL FIELD

This application relates to a perovskite solar cell. In addition, this application also relates to a fabrication method of perovskite solar cell.

BACKGROUND

In recent years, problems of global energy shortage and environmental pollution are becoming increasingly prominent, and solar cells are receiving more and more attention as an ideal renewable energy source. Solar cell, also known as photovoltaic cell, is an apparatus that converts light energy directly into electricity by photoelectric or photochemical effect. The perovskite cell is a new type of solar cell that is widely researched and has rapidly gained high photoelectric conversion efficiency within a few years after its inception, with its highest photoelectric conversion efficiency exceeding 25%, thereby having good application prospects.

Due to the significant advancements in the perovskite solar cell, higher requirements are imposed on energy conversion efficiency, long-term stability, and the like. However, existing perovskite films are more or less subject to various intrinsic defects in the fabrication process. In addition, the perovskite material is unstable and is highly susceptible to decomposition under the influence of light, heat, water and oxygen, thus affecting performance of the perovskite solar cell. Therefore, the existing perovskite solar cell still needs to be improved.

SUMMARY

This application is carried out in view of the foregoing issue, and is intended to provide a perovskite solar cell with a high energy conversion rate and good stability.

In order to achieve the foregoing objective, a first aspect of this application provides a perovskite solar cell structurally including a transparent electrode, an electron transport layer, a perovskite layer, a hole transport layer and a second electrode in sequence, where the perovskite layer includes a main perovskite layer and a one-dimensional perovskite coating layer covering surface and periphery of the main perovskite layer, where the one-dimensional perovskite coating layer includes:

a first overlay layer disposed between the main perovskite layer and the electron transport layer; and a second overlay layer disposed between the main perovskite layer and the hole transport layer.

Using one-dimensional perovskite layers to coat the upper and lower surfaces of the main perovskite layer has the following advantages:

(1) the one-dimensional perovskite coating layer can inhibit ion migration, thus reducing the degradation of perovskite due to light;

(2) formation energy of the one-dimensional perovskite coating layer is low, so intrinsic stability is high;

(3) the A-site ion in the one-dimensional perovskite coating layer is a hydrophobic organic cation, which is not volatile and thus has high stability;

(4) the cation as the A-site ion in the overlay layer material has a strong interaction with the iodide ion in the main perovskite, which can form interfacial anchoring and inhibit B-X (such as Pb—I) octahedral rotation, thus improving phase stability of the perovskite;

(5) the one-dimensional perovskite layers are able to improve interfacial stability when covering the surface of the main perovskite layer and forming an interface with it;

(6) the one-dimensional perovskite coating layer can well block erosion of external water, oxygen and ultraviolet light.

In any implementation, the one-dimensional perovskite coating layer further includes a third overlay layer covering a periphery of the main perovskite layer.

Fully coating the main perovskite layer, or full covering the upper and lower surfaces and the periphery, results in better long-term stability of a battery device as compared to perovskite with only the upper and lower surfaces covered.

In any implementation, thicknesses of the first overlay layer, the second overlay layer, and the third overlay layer are each independently 1 to 20 nm, optionally 2 nm to 5 nm.

The thicknesses of the first overlay layer, the second overlay layer, and the third overlay layer are in the foregoing range, which can improve the photoelectric conversion efficiency of the perovskite solar cell.

In addition, since intrinsic resistance of the formed one-dimensional perovskite is relatively large, the thicknesses of the first and second overlay layers need to be regulated within the foregoing range to balance the performance of the solar cell.

With the one-dimensional perovskite coating layer described in this application is used, a passivation layer is optionally no longer used to passivate the main perovskite layer.

In any implementation, an absolute value of a difference between LUMO energy level of the first overlay layer and LUMO energy level of the main perovskite layer is in a range of 0 eV to 0.3 eV, optionally in a range of 0.05 eV to 0.25 eV.

In any implementation, LUMO energy level of the first overlay layer is greater than or equal to LUMO energy level of the electron transport layer, and an absolute value of a difference between the LUMO energy level of the first overlay layer and the LUMO energy level of the electron transport layer is in a range of 0 eV to 0.6 eV, optionally in a range of 0.3 eV to 0.5 eV.

The LUMO energy level between the first overlay layer and the main perovskite layer and that between the first overlay layer and the electron transport layer have the foregoing relationship, which helps the electrons to reach the electron transport layer from the perovskite layer, thus ensuring a battery open voltage and improving the photoelectric conversion efficiency of the solar cell.

Regulation of the LUMO energy level of the first overlay layer can alternatively be achieved by regulating thickness and material.

In any implementation, HOMO energy level of the second overlay layer is greater than or equal to HOMO energy level of the main perovskite layer, and an absolute value of a difference between the HOMO energy level of the second overlay layer and the HOMO energy level of the main perovskite layer is in a range of 0 eV to 0.3 eV, optionally in a range of 0.05 eV to 0.1 eV.

In any implementation, HOMO energy level of the second overlay layer is less than or equal to HOMO energy level of the hole transport layer, and an absolute value of a difference between the HOMO energy level of the second overlay layer and the HOMO energy level of the hole transport layer is in a range of 0 eV to 0.3 eV, optionally in a range of 0 eV to 0.15 eV.

The HOMO energy level between the second overlay layer and the main perovskite layer and that between the second overlay layer and the hole transport layer have the foregoing relationship, which facilitates the holes to reach the hole transport layer from the perovskite layer, thus ensuring the battery open voltage and improving the photoelectric conversion efficiency of the solar cell.

In any implementation, overlay layer materials of the first overlay layer, the second overlay layer, and the third overlay layer are each independently selected from halogen salts of at least one of the following substances or derivatives thereof:

1-(2-pyridyl)-1H-pyrazole, pyrrolidine iodide, propargyl ammonium cation, tetrabutylammonium cation, or 2-chlorotriethylammonium cation.

The halogen salt may be iodine salt, bromine salt, or chloride salt, optionally the iodine salt.

In any implementation, one of the first overlay layer and the second overlay layer is formed by the overlay layer material and a halogenated metal salt, and optionally, molar ratio of the overlay layer material and the halogenated metal salt is in a range of 1:0.9 to 1:1.3, optionally in a range of 1:1.05 to 1:1.2.

The molar ratio of the overlay layer material and the halogenated metal salt affects energy level of an obtained overlay layer, thus affecting the performance of the solar cell. Therefore, the energy level of the overlay layer can be regulated by regulating the molar ratio of the overlay layer material and the halogenated metal salt to achieve better performance, and optionally, the molar ratio is within the foregoing range.

In any implementation, the halogenated metal salt is selected from at least one of lead iodide, lead bromide, or lead chloride, optionally lead iodide.

A second aspect of this application provides a fabrication method of perovskite solar cell, including a step of fabricating or preparing a transparent electrode, a step of fabricating an electron transport layer, a step of fabricating a perovskite layer, a step of fabricating a hole transport layer, and a step of fabricating a second electrode, where the perovskite layer includes a main perovskite layer and a one-dimensional perovskite coating layer covering surface and periphery of the main perovskite layer, where the one-dimensional perovskite coating layer includes:

a first overlay layer disposed between the main perovskite layer and the electron transport layer; and a second overlay layer disposed between the main perovskite layer and the hole transport layer.

In any implementation, the step of fabricating a perovskite layer includes the following operations:

(1) applying an overlay layer material and a halogenated metal salt to the electron transport layer or the hole transport layer to obtain a primer overlay layer, (2) applying a material for fabricating the main perovskite to the primer overlay layer to obtain the main perovskite layer, and (3) applying an overlay layer material to the main perovskite layer to obtain a surface overlay layer, where either one of the primer overlay layer and the surface overlay layer is a first overlay layer and the other one is a second overlay layer.

The perovskite solar cell in this application can be fabricated using a conventional technical manner in the art. Optionally, the perovskite layer is fabricated by at least one of the following methods: chemical bath deposition method, electrochemical deposition method, chemical evaporation method, physical epitaxy growth method, co-evaporation method, atomic layer deposition method, precursor liquid spin coating method (spin coating), precursor liquid slit coating method, precursor liquid scraping method, mechanical pressing method; optionally, the thermal evaporation deposition method and the precursor liquid coating (spin coating) method.

Optionally, the coating in (1) is carried out by co-evaporation.

Optionally, the coating in (2) is carried out by evaporation.

Optionally, the coating in (3) is carried out by spin coating, followed by heating.

In any implementation, the fabrication method of perovskite solar cell further includes a step of fabricating a third overlay layer covering the periphery of the main perovskite layer, where the step specifically includes the following operations:

(4) applying a protective layer material to the surface overlay layer to obtain a protective layer, (5) adding a solution of a coating layer material to the protective layer, making the solution flow to around the main perovskite layer and the protective layer to cover the entire periphery, and performing heating, to obtain a periphery overlay layer as a third overlay layer, and (6) removing the protective layer.

Optionally, thickness of the protective layer is 1 to 10 nm.

Optionally, a protective layer is used during fabrication of the third overlay layer of the perovskite solar cell, so that the fabrication of the third overlay layer is more controllable and easier to regulate the thickness and material.

In any implementation, in the fabrication method of perovskite solar cell, the overlay layer materials in (1), (3), and (5) are each independently selected from halogen salts of at least one of the following substances or derivatives thereof:

1-(2-pyridyl)-1H-pyrazole, pyrrolidine iodide, propargyl ammonium cation, tetrabutylammonium cation, or 2-chlorotriethylammonium cation.

In any implementation, in the fabrication method of perovskite solar cell, in (1), a molar ratio of the overlay layer material and the halogenated metal salt is in a range of 1:0.9 to 1:1.3, optionally in a range of 1:1.05 to 1:1.2.

In any implementation, in the fabrication method of perovskite solar cell, the halogenated metal salt is selected from at least one of lead iodide, lead bromide, or lead chloride, optionally lead iodide.

In any implementation, the application is carried out by spin-coating, co-evaporation or deposition, and optionally, in (4), the application is carried out by spin-coating, and heating is performed after the spin-coating is complete, so as to obtain the protective layer.

Optionally, in (5) to (6), the application is carried out by spin coating.

In any implementation, in (6), a solvent is used to dissolve the protective layer, and optionally, the solvent for dissolving the protective layer is trifluoroethanol; and then the protective layer and substances on the protective layer are shaken off by spinning.

In any implementation, the protective layer material is lead pyridine-2-carboxylate.

A third aspect of this application provides an electric apparatus including a perovskite solar cell described in this application or a perovskite solar cell fabricated via the fabrication method for perovskite solar cell described in this application.

DESCRIPTION OF EMBODIMENTS

Figure 1:
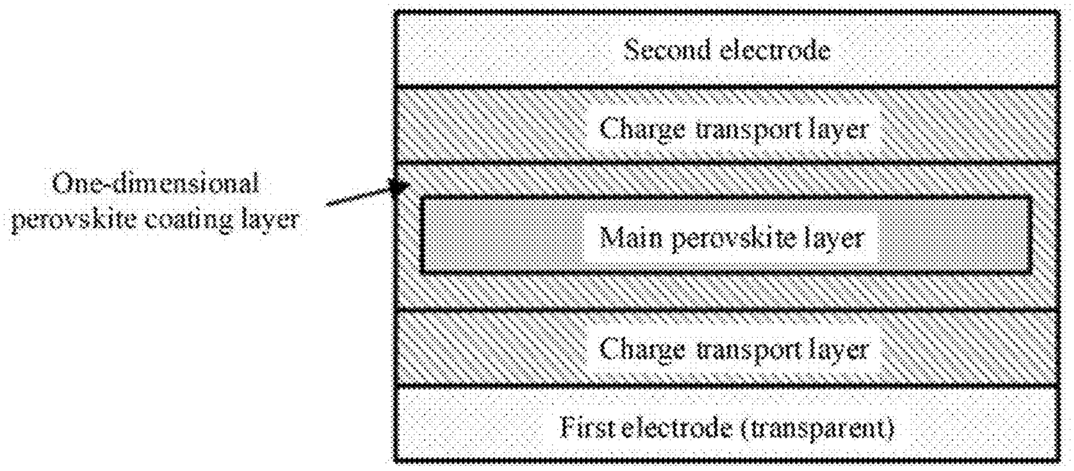
FIG. 1 is a schematic diagram of a structure of a perovskite solar cell. As shown in the figure, the perovskite solar cell includes, from bottom upwards, a transparent electrode (that is, a first electrode), a charge transport layer, a perovskite body layer (that is, a main perovskite layer) and a one-dimensional perovskite coating layer, a charge transport layer, and a second electrode that are coated on a periphery of the perovskite body layer. The two charge transport layers are different, and are respectively an electron transport layer or an electron hole transport layer. This schematic diagram shows fully coating of upper and lower surfaces and the periphery of the perovskite body layer by the one-dimensional perovskite coating layer.

The following specifically discloses embodiments of the perovskite solar cell in detail with appropriate reference to the accompanying drawings. However, there may be cases where unnecessary detailed descriptions are omitted. For example, detailed descriptions of well-known matters and repeated descriptions of actually identical structures have been omitted. This is to avoid unnecessarily prolonging the following description, for ease of understanding by persons skilled in the art. In addition, the accompanying drawings and the following descriptions are provided for persons skilled in the art to fully understand this application and are not intended to limit the subject matter recorded in the claims.

"Ranges" disclosed in this application are defined in the form of lower and upper limits. A given range is defined by one lower limit and one upper limit selected, where the selected lower and upper limits define boundaries of that particular range.

Ranges defined in this method may or may not include end values, and any combinations may be used, meaning any lower limit may be combined with any upper limit to form a range. For example, if ranges of 60-120 and 80-110 are provided for a specific parameter, it is understood that ranges of 60-110 and 80-120 can also be envisioned. In addition, if minimum values of a range are given as 1 and 2, and maximum values of the range are given as 3, 4, and 5, the following ranges can all be envisioned: 1-3, 1-4, 1-5, 2-3, 2-4, and 2-6. In this application, unless otherwise stated, a value range of "a-b" is a short representation of any combination of real numbers between a and b, where both a and b are real numbers. For example, a value range of "0-5" means that all real numbers in the range of "0-5" are listed herein, and "0-5" is just a short representation of a combination of these values. In addition, a parameter expressed as an integer greater than or equal to 2 is equivalent to disclosure that the parameter is, for example, an integer among 2, 3, 4, 5, 6, 7, 8, 9, 10, 11, 12, and so on.

Unless otherwise specified, all the embodiments and optional embodiments of this application can be combined with each other to form new technical solutions.

Unless otherwise specified, all the technical features and optional technical features of this application can be combined with each other to form new technical solutions.

Unless otherwise specified, all the steps in this application can be performed in the order described or in random order, and optionally, in the order described. For example, a method including steps (a) and (b) indicates that the method may include steps (a) and (b) performed in order or may include steps (b) and (a) performed in order. For example, the foregoing method may further include step (c), which indicates that step (c) may be added to the method in any ordinal position, for example, the method may include steps (a), (b), and (c), steps (a), (c), and (b), steps (c), (a), and (b), or the like.

Unless otherwise specified, "include" and "contain" mentioned in this application are inclusive or may be exclusive. For example, terms "include" and "contain" can mean that other unlisted components may also be included or contained, or only listed components are included or contained.

Unless otherwise specified, in this application, the term "or" is inclusive. For example, the phrase "A or B" means "A, B, or both A and B". More specifically, any one of the following conditions satisfies the condition "A or B": A is true (or present) and B is false (or not present); A is false (or not present) and B is true (or present); or both A and B are true (or present).

Fabrication of a perovskite solar cell includes fabrication of a perovskite layer. However, intrinsic defects such as vacancy defects, interstitial defects, and antisite defects appear more or less on the surface of the fabricated perovskite films. These defects cause the component ions in the perovskite, especially the methylamine and formamidine ions on the A site to migrate, escape and degrade. In addition, water, oxygen, ultraviolet light, and the like in the air or environment can cross some charge transport layers and reach the perovskite layer, and their contact with perovskite may cause the perovskite to degrade and decompose. The existence of these problems makes the structure of perovskite prone to being damaged and to failure of the solar cell component.

After researching the foregoing problems, it is considered that the key to solve these problems is to suppress the defects and ion migration on the surface of perovskite, and to block water, oxygen, and ultraviolet light from the environment. While achieving the foregoing goals, introduction of heterogeneous structures should be minimized, for example, addition of heterogeneous interfaces with the corresponding process should be avoided. Coating surface of the main perovskite layer (the non-coated three-dimensional perovskite layer is referred to as the "main perovskite layer" for convenience) with a one-dimensional perovskite coating layer is an ideal solution to the foregoing problems. Intrinsic stability of the one-dimensional perovskite coating layer is superior, even higher than intrinsic stability of the one-dimensional perovskite material. In addition, the one-dimensional perovskite coating layer covers surface of the main perovskite, which can block water, oxygen and ultraviolet light and forms an interface between the main perovskite layer, improving interfacial stability. In addition, fully coating the upper and lower surfaces and the periphery of the main perovskite layer can significantly improve the stability of the perovskite solar cell.

Accordingly, a first aspect of this application provides a perovskite solar cell structurally including a transparent electrode, an electron transport layer, a perovskite layer, a hole transport layer and a second electrode in sequence, where The perovskite layer includes a main perovskite layer and a one-dimensional perovskite coating layer covering surface and periphery of the main perovskite layer, where the one-dimensional perovskite coating layer includes:

a first overlay layer disposed between the main perovskite layer and the electron transport layer; and a second overlay layer disposed between the main perovskite layer and the hole transport layer.

The perovskite solar cell described in this application may include, from bottom upwards, a transparent electrode, an electron transport layer, a perovskite layer, a hole transport layer, and a second electrode, or from top downwards, a transparent electrode, a hole transport layer, a perovskite layer, an electron transport layer, and a second electrode, as shown in FIG. 1, with sunlight incident from below. The transparent electrode is an electrode used for light incidence. In this application, the transparent electrode is also called a first electrode.

In terms of spatial dimensional structure, the perovskite structure can be classified as zero-dimensional, one-dimensional, two-dimensional, and three-dimensional.

A fabrication process of one-dimensional perovskite coating layer is similar to a fabrication process of two-dimensional perovskite coating layer. Co-evaporation of $PbI_2$ and propargyl ammonium iodide is used as an example. In a process of fabricating the primer overlay layer by thermal evaporation, the solid powder of the two salts is used as an evaporation source, and the two salts are evaporated in molecular form under a specific vacuum and temperature, and meet in the air or on a substrate above to form a coplanar one-dimensional perovskite structure and deposit on surface of the substrate. In the process of fabricating the surface layer and the surrounding layer by, for example, spin-coating, the spin-coating of, for example, propargylammonium iodide salt on the surface and around the main perovskite layer, followed by heating and annealing, excessive $PbI_2$ in the main perovskite layer is combined with the propargylammonium iodide salt to form the one-dimensional perovskite structure.

A structure of an obtained overlay layer varies greatly depending on the overlay layer material used, resulting in a one-dimensional perovskite coating layer and a two-dimensional perovskite coating layer. The one-dimensional perovskite and two-dimensional perovskite overlays can be distinguished via X-ray diffraction.

It is believed that a formation mechanism of the one-dimensional perovskite coating layer is as follows: cations of the used overlay layer material are used as A-site cations, which induce a discontinuous coplanar arrangement between octahedra during formation of B-X (such as Pb—I) octahedral lamellar structure. A spatial stacking mode between the A-site cations brings a high mutual repulsion, thus the B-X (such as Pb—I) octahedral framework is widely spaced, in turn forming a one-dimensional perovskite structure.

Using one-dimensional perovskite layers to coat the upper and lower surfaces of the main perovskite layer has the following advantages:

(1) the one-dimensional perovskite coating layer can inhibit ion migration, thus reducing the degradation of perovskite due to light;

(2) formation energy of the one-dimensional perovskite coating layer is low, so intrinsic stability is high;

(3) the A-site ion in the one-dimensional perovskite coating layer is a hydrophobic organic cation, which is not volatile and thus has high stability;

(4) the cation as the A-site ion in the overlay layer material has a strong interaction with the iodide ion in the main perovskite, which can form interfacial anchoring and inhibit B-X (such as Pb—I) octahedral rotation, thus improving phase stability of the perovskite;

(5) the one-dimensional perovskite layers are able to improve interfacial stability when covering the surface of the main perovskite layer and forming an interface with it;

(6) the one-dimensional perovskite coating layer can well block erosion of external water, oxygen and ultraviolet light.

Therefore, the perovskite layer described in this application is suitable to fit with an electron transport layer or a hole transport layer that is less capable of blocking water, oxygen, and ultraviolet light.

The one-dimensional perovskite coating layer is more stable and has a better ability to block water, oxygen, and ultraviolet light than the two-dimensional perovskite coating layer. In addition, the one-dimensional perovskite coating layer is required to be thinner because it can isolate some connection such as iodine-lead connections, resulting in poor electrical conductivity.

Figure 2:
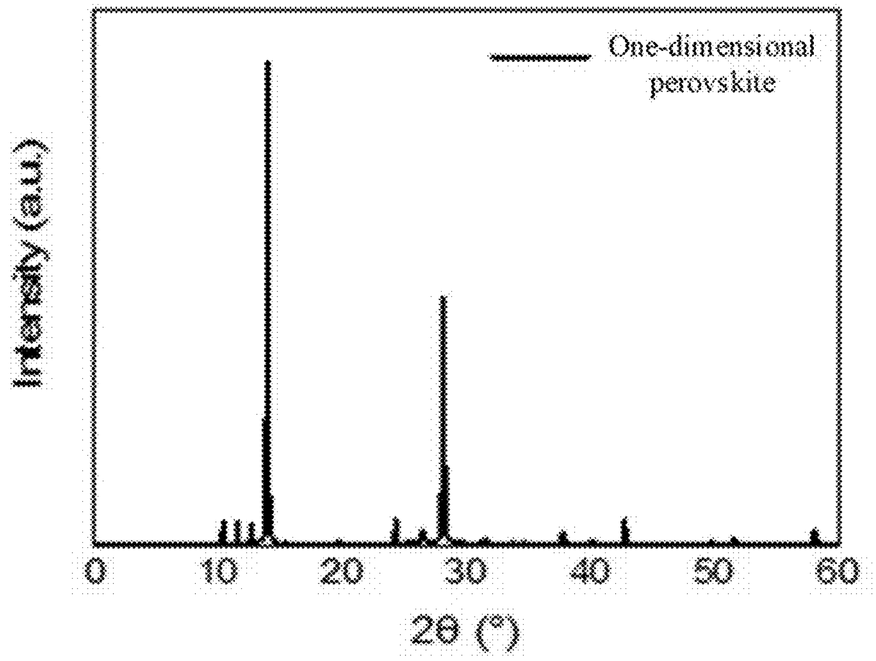
FIG. 2 is an X-ray diffraction pattern of a surface layer (second overlay layer) of the one-dimensional perovskite coating layer fabricated in Example I-1 of this application. As shown in the figure, the first two peaks are structural peaks of the one-dimensional perovskite coating layer and the later peaks are all structural peaks of the main perovskite layer.

FIG. 2 is an X-ray diffraction pattern of a surface layer (second overlay layer) of the one-dimensional perovskite coating layer fabricated in Example I-1 of this application. This proves that it is a one-dimensional perovskite coating layer formed in this application.

In some embodiments, the one-dimensional perovskite coating layer further includes a third overlay layer covering a periphery of the main perovskite layer.

Fully coating the main perovskite layer, or full covering the upper and lower surfaces and the periphery, results in better long-term stability of a battery device as compared to perovskite with only the upper and lower surfaces covered.

In some embodiments, thicknesses of the first overlay layer, the second overlay layer, and the third overlay layer are each independently 1 to 20 nm, optionally 2 nm to 5 nm.

The thicknesses of the first overlay layer and the second overlay layer are in the foregoing range, which can improve the photoelectric conversion efficiency of the perovskite solar cell.

In addition, since intrinsic resistance of the formed one-dimensional perovskite is relatively large, the thicknesses of the first and second overlay layers need to be regulated within the foregoing range to balance the performance of the solar cell.

With the one-dimensional perovskite coating layer described in this application is used, a passivation layer is optionally no longer used to passivate the main perovskite layer.

In some embodiments, an absolute value of a difference between LUMO energy level of the first overlay layer and LUMO energy level of the main perovskite layer is in a range of 0 eV to 0.3 eV, optionally in a range of 0.05 eV to 0.25 eV.

In some embodiments, LUMO energy level of the first overlay layer is greater than or equal to LUMO energy level of the electron transport layer, and an absolute value of a difference between the LUMO energy level of the first overlay layer and the LUMO energy level of the electron transport layer is in a range of 0 eV to 0.6 eV, optionally in a range of 0.3 eV to 0.5 eV.

The LUMO energy level between the first overlay layer and the main perovskite layer and that between the first overlay layer and the electron transport layer have the foregoing relationship, which helps the electrons to reach the electron transport layer from the perovskite layer, thus ensuring a battery open voltage and improving the photoelectric conversion efficiency of the solar cell.

Regulation of the LUMO energy level of the first overlay layer can alternatively be achieved by regulating thickness and material.

In some embodiments, HOMO energy level of the second overlay layer is greater than or equal to HOMO energy level of the main perovskite layer, and an absolute value of a difference between the HOMO energy level of the second overlay layer and the HOMO energy level of the main perovskite layer is in a range of 0 eV to 0.3 eV, optionally in a range of 0.05 eV to 0.1 eV.

In some embodiments, HOMO energy level of the second overlay layer is less than or equal to HOMO energy level of the hole transport layer, and an absolute value of a difference between the HOMO energy level of the second overlay layer and the HOMO energy level of the hole transport layer is in a range of 0 eV to 0.3 eV, optionally in a range of 0 eV to 0.15 eV.

The HOMO energy level between the second overlay layer and the main perovskite layer and that between the second overlay layer and the hole transport layer have the foregoing relationship, which facilitates the holes to reach the hole transport layer from the perovskite layer, thus ensuring the battery open voltage and improving the photoelectric conversion efficiency of the solar cell.

In some embodiments, overlay layer materials of the first overlay layer, the second overlay layer, and the third overlay layer are each independently selected from halogen salts of at least one of the following substances or derivatives thereof:

1-(2-pyridyl)-1H-pyrazole, pyrrolidine iodide, propargyl ammonium cation, tetrabutylammonium cation, or 2-chlorotriethylammonium cation.

The halogen salt may be iodine salt, bromine salt, or chloride salt, optionally the iodine salt.

In actual operation, a material for covering is in a form of ionic compounds. The overlay layer material may take the form of a salt (theoretically all non-interfering salts are selectable, preferably halogen salts), and then the salt is disposed in direct contact with the main perovskite layer.

In some implementations, one of the first overlay layer and the second overlay layer is formed by the overlay layer material and a halogenated metal salt, and optionally, molar ratio of the overlay layer material and the halogenated metal salt is in a range of 1:0.9 to 1:1.3, optionally in a range of 1:1.05 to 1:1.2.

The molar ratio of the overlay layer material and the halogenated metal salt affects energy level of an obtained overlay layer, thus affecting the performance of the solar cell. Therefore, the energy level of the overlay layer can be regulated by regulating the molar ratio of the overlay layer material and the halogenated metal salt to achieve better performance, and optionally, the molar ratio is within the foregoing range.

In a case that one of the first overlay layer and the second overlay layer is formed by the foregoing overlay layer material and halogenated metal salt, the other one of the first overlay layer and the second overlay layer is fabricated by using the overlay layer material without using the halogenated metal salt. In actual operation, the earlier fabricated layer of the first and the second overlay layers is a primer layer, where the overlay layer material and the halogenated metal salt are used to form the one-dimensional perovskite structure, optionally by co-evaporation. The later fabricated layer is the surface layer, where only the overlay layer material is used without the halogenated metal salt, because the fabricated main perovskite layer usually has excessive X anions, which can interact with the overlay layer material to form a surface overlay layer. In a case that no excessive X anion is present or insufficient X anion is present in the fabricated body perovskite layer, an X anion salt, such as a halogenated metal salt, may be used in the fabrication of the surface layer as appropriate.

In some implementations, the halogenated metal salt is selected from at least one of lead iodide, lead bromide, or lead chloride, optionally lead iodide.

A second aspect of this application provides a fabrication method of perovskite solar cell, including a step of fabricating or preparing a transparent electrode, a step of fabricating an electron transport layer, a step of fabricating a perovskite layer, a step of fabricating a hole transport layer, and a step of fabricating a second electrode, where the perovskite layer includes a main perovskite layer and a one-dimensional perovskite coating layer covering surface and periphery of the main perovskite layer, where the one-dimensional perovskite coating layer includes:

a first overlay layer disposed between the main perovskite layer and the electron transport layer; and a second overlay layer disposed between the main perovskite layer and the hole transport layer.

In some embodiments, the step of fabricating a perovskite layer includes the following operations:

(1) applying an overlay layer material and a halogenated metal salt to the electron transport layer or the hole transport layer to obtain a primer overlay layer, (2) applying a material for fabricating the main perovskite to the primer overlay layer to obtain the main perovskite layer, and (3) applying an overlay layer material to the main perovskite layer to obtain a surface overlay layer, where either one of the primer overlay layer and the surface overlay layer is a first overlay layer and the other one is a second overlay layer.

The perovskite solar cell in this application can be fabricated using a conventional technical manner in the art. Optionally, the perovskite layer is fabricated by at least one of the following methods: chemical bath deposition method, electrochemical deposition method, chemical evaporation method, physical epitaxy growth method, co-evaporation method, atomic layer deposition method, precursor liquid spin coating method (spin coating), precursor liquid slit coating method, precursor liquid scraping method, mechanical pressing method; optionally, the thermal evaporation deposition method and the precursor liquid coating (spin coating) method. This application does not limit the fabrication method of the perovskite layer specifically, as long as it can achieve the desired purpose. Optionally, the "coating" described in this application is carried out by the foregoing method.

Optionally, the coating in (1) is carried out by co-evaporation. The "co-evaporation" described in this application can be carried out by using powder of two or more substances as evaporation sources. For example, the forming of perovskite. Powder of a corresponding substance is evaporated in molecular form as an evaporation source under a specified vacuum degree and temperature, and these molecules meet in the air or at a substrate and undergo a chemistry reaction to form a perovskite structure and deposit on a substrate surface.

Optionally, the coating in (2) is carried out by evaporation.

Optionally, the coating in (3) is carried out by spin coating, followed by heating.

In some implementations, the fabrication method of perovskite solar cell further includes a step of fabricating a third overlay layer covering the periphery of the main perovskite layer, where the step specifically includes the following operations:

(4) applying a protective layer material to the surface overlay layer to obtain a protective layer, (5) adding a solution of a coating layer material to the protective layer, making the solution flow to around the main perovskite layer and the protective layer to cover the entire periphery, and performing heating, to obtain a periphery overlay layer as a third overlay layer, and (6) removing the protective layer.

In this application, the terms "overlay layer material" and "overlay layer material" are used synonymously.

Optionally, a protective layer is used during fabrication of the third overlay layer of the perovskite solar cell, so that the fabrication of the third overlay layer is more controllable and easier to regulate the thickness and material.

Optionally, thickness of the protective layer is 1 to 10 nm.

In some implementations, in the fabrication method of perovskite solar cell, the overlay layer materials in (1), (3), and (5) are each independently selected from halogen salts of at least one of the following substances or derivatives thereof:

1-(2-pyridyl)-1H-pyrazole, pyrrolidine iodide, propargyl ammonium cation, tetrabutylammonium cation, or 2-chlorotriethylammonium cation.

In some implementations, in the fabrication method of perovskite solar cell, in (1), a molar ratio of the overlay layer material and the halogenated metal salt is in a range of 1:0.9 to 1:1.3, optionally in a range of 1:1.05 to 1:1.2.

In some implementations, in the fabrication method of perovskite solar cell, the halogenated metal salt is selected from at least one of lead iodide, lead bromide, or lead chloride, optionally lead iodide.

In some implementations, the application is carried out by spin-coating, co-evaporation or deposition, and optionally, in (4), the application is carried out by spin-coating, and heating is performed after the spin-coating is complete, so as to obtain the protective layer.

Optionally, in (5) to (6), the application is carried out by spin coating.

In some implementations, in (6), a solvent is used to dissolve the protective layer, and optionally, the solvent for dissolving the protective layer is trifluoroethanol; and then the protective layer and substances on the protective layer are shaken off by spinning.

In some implementations, the protective layer material is lead pyridine-2-carboxylate.

In some optional implementations, the protective layer may not be used in the fabrication of the periphery overlay layer (or the third overlay layer), and a periphery overlay layer may be fabricated while fabricating a surface overlay layer. In this case, the surface overlay layer and the periphery overlay layer have the same A-site ion. A specific procedure example of is as follows: a solution of the overlay layer material (such as isopropyl alcohol solution of propargyl ammonium iodide) is excessively added (by spin coating) to not only cover the main perovskite layer but also to flow to around the main perovskite layer to cover the entire periphery, followed by heating and annealing, to obtain both the surface overlay layer and the periphery overlay layer in the form of one-dimensional perovskite.

In this application, description of the perovskite solar cells also applies to fabrication method of perovskite solar cell.

A third aspect of this application provides an electric apparatus including a perovskite solar cell described in this application or a perovskite solar cell fabricated via the fabrication method for perovskite solar cell described in this application.

The following briefly describes the main perovskite layer, electron transport layer, hole transport layer and electrode structure of the perovskite solar cell, but this application is not limited to these.

Main Perovskite Layer

The main perovskite layer can be fabricated using any perovskite material conventionally used in the art. Optionally, the material used to fabricate the main perovskite is $FAPbI_3$ single crystal.

Optionally, this application uses $ABX_3$-type main perovskite, where A is an inorganic, organic, or organic-inorganic hybrid cation, B is an inorganic, organic, or organic-inorganic hybrid cation, and X is an inorganic, organic, or organic-inorganic hybrid anion. For example, the A-site ion may be methylamine cation $MA^+$, the formamidine cation $FA^+$, $Cs^+$, and a mixture thereof; the B-site ion may be $Pb^{2+}$, $Sn^{2+}$, and a mixture thereof; the X-site ion may be a halogen ion, $COO^-$ and a mixture thereof.

Optionally, the main perovskite layer can be fabricated by evaporation (such as FAPbI3 single crystal).

Transparent Electrode and Second Electrode

The transparent electrode, the second electrode described in this application may be any electrode used in the art. Optionally, the electrode material of the transparent electrode, second electrode is an organic, inorganic, or organic-inorganic hybrid conductive material. For example, the organic conductive material may be a conductive polymer such as poly(3,4-ethylenedioxythiophene) (PEDOT), polythiophene, polyacetylene; the inorganic conductive material may be a transparent conductive oxide such as fluorine-doped tin oxide (FTO), indium tin oxide (ITO), aluminum doped zinc oxide (AZO); metal; carbon derivatives, and the like.

The transparent electrode is used for light incidence, and is usually made of a transparent conductive oxide. Generally, the transparent conductive oxide includes a glass substrate and an oxide film (referred to as TCO) conductive layer. Commonly used TCOs are ITO, FTO, and AZO, but this application is not limited to these. The conductive glass needs to be cleaned before use, for example, by ultrasonic cleaning with cleaning agents (including but not limited to surfactants), ethanol, acetone, isopropanol, deionized water, and the like.

The second electrode is for collecting charge carriers and is selected from metal or carbon derivatives, fabricated by methods known in the art, such as thermal evaporation, with a thickness of 20 nm to 1000 nm. In a specific embodiment of this application, the second electrode is made of metallic silver and fabricated by evaporation, with a thickness of 50 nm to 120 nm.

Hole Transport Layer

The hole transport layer is used for collecting and extracting holes from the perovskite layer. The hole transport layer can be made of any hole transport layer material conventionally used in the art, optionally a hole transport layer material satisfying the foregoing HOMO energy level matching.

Optionally, for example, the hole transport layer is made of at least one of the following materials and their derivatives: poly[bis(4-phenyl)(2,4,6-trimethylphenyl)amine] (PTAA), 2,2',7,7'-tetrakis[N,N-bis(4-methoxyphenyl) amino]-9,9'-spirobifluorene (Spiro-OMeTAD), poly-3-hexylthiophene (P3HT), triptycene-based triphenylamine (H101), 3,4-ethylenedioxythiophene-methoxytriphenylamine (EDOT-OMeTPA), N-(4-anilino)carbazole-spirobifluorene (CzPAF-SBF), poly(3,4-ethylenedioxythiophene) thiophene):poly(styrene sulfonic acid) (PEDOT:PSS), polythiophene, nickel oxide (NiOx), molybdenum oxide ($MoO_3$), cuprous iodide (CuI), cuprous oxide ($Cu_2O$), and the like.

Thickness of the hole transport layer can range from 5 nm to 300 nm, optionally from 100 nm to 200 nm.

Electron Transport Layer

The electron transport layer is used for collecting and extracting electrons from the perovskite layer. The electron transport layer can be made of any electron transport layer material used in the art, optionally an electron transport layer material satisfying the foregoing HOMO energy level matching.

Optionally, for example, the electron transport layer is made of at least one of the following materials and their derivatives: [6,6]-phenyl-$C_{61}$-butyric acid methyl ester ($PC_{61}BM$), [6,6]-phenyl-$C_{71}$-butyric acid methyl ester ($PC_{71}BM$), fullerene C60 (C60), fullerene C70 (C70), tin dioxide ($SnO_2$), zinc oxide (ZnO), titanium dioxide ($TiO_2$), and the like.

Thickness of the electron transport layer can range from 5 nm to 200 nm, optionally from 20 nm to 100 nm.

Both the hole transport layer and the electron transport layer can be fabricated using methods commonly used in the field.

EXAMPLES

The following describes examples of this application. The examples described below are illustrative and only used for explaining this application, and cannot be construed as limitations on this application. Examples whose technical solutions or conditions are not specified are made in accordance with technical solutions or conditions described in literature in the field or made in accordance with product instructions. The reagents or instruments used are all conventional products that are commercially available if no manufacturer is indicated.

I. Fabrication of Perovskite Solar Cell

Example I-1

[Transparent Electrode]

Surface of the FTO conductive glass with a size of 2.0 cm×2.0 cm was cleaned twice with acetone and isopropyl alcohol in turn, immersed in deionized water and sonicated for 10 min, dried in a blast dryer and placed in a glove box ($N_2$ atmosphere) to be used, and a transparent electrode was obtained.

[Electron Transport Layer]

3 wt % of $SnO_2$ nanocolloid aqueous solution was spin-coated on the FTO film layer of the transparent electrode using a spin coater (LEBO EZ6-S, same below) for 30 seconds. Followed by heating at 150° C. for 15 min on a constant temperature heating table, the electron transport layer with thickness of 30 nm was obtained.

[Perovskite Layer]

A fabrication process of the perovskite layer was as follows:

Step 1: Fabrication of One-Dimensional Perovskite Base Layer (First Overlay Layer)

The foregoing sample with transparent electrode and electron transport layer was put into a vacuum coater, under a vacuum condition of $5\times10^{-4}$ Pa, the alkynylammonium iodide salt and $PbI_2$ with molar ratio of 1:1.1 was co-evaporated on the surface of electron transport layer, so that the two substances reacted chemically to form a perovskite structure and were deposited on the surface of the sample. The evaporation rate ratio was 1:1 (evaporation rate of 0.1 Å/s) to obtain a one-dimensional perovskite substrate layer with a thickness of 3 nm.

Step 2: Fabrication of the Main Perovskite Layer

An evaporation source was replaced with $FAPbI_3$ single crystal, and $FAPbI_3$ main perovskite layer with a thickness of 500 nm was evaporated on the surface of the one-dimensional perovskite base layer obtained in Step 1.

Step 3: Fabrication of the One-Dimensional Perovskite Surface Layer (Second Overlay Layer)

An isopropyl alcohol solution of propargylammonium iodide salt was spin-coated at a concentration of 5 mg/mL on surface of the $FAPbI_3$ main perovskite layer using a spin coater at 5000 rpm for 30 s, followed by heating at 100° C. for 10 min on a constant temperature heating table, to obtain a one-dimensional perovskite surface layer with a thickness of 5 nm.

In this way, a one-dimensional-three-dimensional-one-dimensional perovskite coating layer with upper and lower surface coated was obtained.

[Hole Transport Layer]

A chlorobenzene solution of Spiro-OMeTAD with a concentration of 73 mg/mL was spin-coated on the obtained perovskite layer using a spin coater at 5000 rpm for 20 s to obtain a hole transport layer with thickness of 150 nm.

[Second Electrode]

The sample with transparent electrode, electron transport layer, perovskite layer and hole transport layer was put into a vacuum coater, and under a vacuum condition of $5\times10^{-4}$ Pa, Ag was evaporated on the surface of the obtained hole transport layer to obtain an Ag electrode with thickness of 80 nm, and a second electrode was obtained.

In this way, the perovskite solar cell of Examples I-1 was obtained.

Examples I-2 to I-5

The perovskite solar cells in Examples I-2 to I-5 were fabricated in a similar manner to Example I-1. Differences lie in the fabrication of perovskite layer. For details, refer to Table 1.

Example I-6

The fabrication of perovskite solar cell in Example I-6 was operated similarly to Example I-1. Differences lie in the fabrication of perovskite layer, which was performed after Step 3 as follows:

Step 4: Addition of Protective Layer

A trifluoroethanol solution of lead pyridine-2-carboxylate at a concentration of 5 mg/mL was spin-coated on the surface of the one-dimensional perovskite surface layer fabricated in Step 3 using a spin coater at 5000 rpm to completely cover the surface of the surface layer, followed by heating at 100° C. for 10 min on the constant temperature heating table, to obtain the protective layer.

Step 5: Addition of Periphery Overlay Layer (Third Overlay Layer)

The protective layer and the perovskite layer of the sample obtained in step 4 were polished and cleaned around the edges using an electric grinder (Bosch GSR120), and width of the protective layer/perovskite layer removed on the periphery was 1 mm. An isopropanol solution of propargyl ammonium iodide at a concentration of 5 mg/mL was spin-coated on the surface of the protective layer of the obtained sample using a spin coater at 5000 rpm to enable it to flow to the polished periphery and completely cover the periphery, followed by heating at 100° C. for 10 min on a constant temperature heating table, to obtain a one-dimensional perovskite periphery overlay layer with thickness of approximately 5 nm.

100 μL of trifluoroethanol solution was excessively added dropwise to dissolve the protective layer, and then the protective layer and the material on top of the protective layer were shaken off using a spin coater spinning at 6000 rpm, followed by heating at 100° C. for 5 min on a constant temperature heating table, to obtain a perovskite layer fully covered by one-dimensional perovskite.

Examples I-7 and I-12

The fabrication of perovskite solar cell of Examples I-7 to I-12 was performed in the same operation as in Example I-6, with differences referring to Table 1.

Examples I-13 to I-14

The fabrication of perovskite solar cell of Examples I-13 to I-14 was performed in the same operation as Example I-1. Differences lie in only thickness of the surface and primer layers of the one-dimensional perovskite coating layer, referring to the following table.

Comparative Example 1

The fabrication of perovskite solar cell in Example I-15 was operated similarly to Example I-1. Differences lie in the fabrication of perovskite layer as follows:

The sample with transparent electrode and electron transport layer was put into a vacuum coater, and under a vacuum condition of $5\times10^{-4}$ Pa, a $FAPbI_3$ primer layer with a thickness of 500 nm and an evaporation source of $FAPbI_3$ single crystal was evaporated on the surface of the electron transport layer, to obtain the perovskite layer.

II. Second Overlay Energy Level Matching Examination

Examples II-1 to II-11

Examples II-1 to II-11 were similar to Example I-1. Differences lie in the fabrication of perovskite layer. For details, refer to Table 2.

III. First Overlay Energy Level Matching Examination

Examples III-1 to III-9

Examples III-1 to III-9 were similar to Example I-1. Differences lie in the fabrication of perovskite layer. For details, refer to Table 3.

IV. Battery Performance Test

Performance tests were conducted on the perovskite solar cells in each of Examples and Comparative Examples.

1. Energy Conversion Efficiency Test

The energy conversion efficiency was measured for the perovskite solar cells of each Example and Comparative Example. Under the atmospheric environment, an AM1.5G standard light source was used to simulate sunlight, and a four-channel digital source meter (Keithley 2440) was used to measure a voltammetric curve of the cell under light irradiation to obtain open-circuit voltage Voc, short-circuit current density Jsc, and fill factor FF (Fill Factor) of the cell, thus calculating the energy conversion efficiency Eff (Efficiency) of the cell.

The energy conversion efficiency is calculated as follows:

$$Eff = Pout/Popt = Voc\times Jsc\times (Vmpp\times Jmpp)/(Voc\times Jsc) = Voc\times Jsc\times FF$$

where Pout, Popt, Vmpp, and Jmpp are respectively battery operating output power, incident light power, maximum battery power point voltage, and maximum power point current.

In this test, the open-circuit voltage Voc is the battery open voltage in Table 2 to Table 3.

2. Battery Stability Test

Stability performance was tested for the perovskite solar cells in each of Examples and Comparative Examples. The cells were placed in air conditions with relative humidity RH of 75% to 80% and ambient temperature of 25° C. to 30° C., and placed without keeping in dark for at least 800 hours, and the energy conversion efficiency before and after placement is measured according to the foregoing test method, and a ratio of cell efficiency after 800 hours of placement to initial efficiency is calculated as a cell stability performance parameter.

3. Energy Level Test

The energy band distribution of each overlay layer was tested at room temperature and pressure using an X-ray-ultraviolet electron energy disperse spectroscopy (XPS-UPS) of model Escalab 250Xi (from Thermo Scientific).

4. Thickness Test of Each Overlay Layer

The sample was fixedly thinned and cross-sectionally made under normal temperature and vacuum conditions using a dual-beam system (FIB-SEM) coupling a focused ion beam (FIB) with a high-resolution scanning electron microscope (SEM) for thickness test.

Refer to Table 1 to Table 3 for test results.

TABLE 1

Effect of material and thickness of one-dimensional perovskite coating layer on battery performance

| Example number | Surface layer material (Second overlay layer) | Primer layer material (First coating layer) | Peripheral material (Third coating layer) | Primer layer thickness (nm) | Surface layer | Peripheral thickness (nm) | Energy conversion efficiency (%) | Cell efficiency after 800 h placement (%) | Cell stability performance (%) |
|---|---|---|---|---|---|---|---|---|---|
| | One-dimensional perovskite coating layer | | | | | | | | |
| I-1 | Propargyl ammonium iodide salt | Propargyl ammonium iodide salt | Propargyl ammonium iodide salt | 3 | 3 | 0 | 21.6 | 21.00 | 97.2 |
| I-2 | Propargyl ammonium iodide salt | Propargyl ammonium iodide salt | Propargyl ammonium iodide salt | 2 | 3 | 0 | 21.2 | 20.46 | 96.5 |
| I-3 | Propargyl ammonium iodide salt | Propargyl ammonium iodide salt | Propargyl ammonium iodide salt | 5 | 3 | 0 | 21.0 | 20.16 | 96.0 |
| I-4 | Propargyl ammonium iodide salt | Propargyl ammonium iodide salt | Propargyl ammonium iodide salt | 10 | 3 | 0 | 20.8 | 19.76 | 95.0 |
| I-5 | Propargyl ammonium iodide salt | Propargyl ammonium iodide salt | Propargyl ammonium iodide salt | 20 | 3 | 0 | 20.4 | 19.09 | 93.6 |
| I-6 | Propargyl ammonium iodide salt | Propargyl ammonium iodide salt | Propargyl ammonium iodide salt | 3 | 3 | 5 | 21.7 | 21.27 | 98.0 |
| I-7 | Propargyl ammonium iodide salt | Propargyl ammonium iodide salt | Propargyl ammonium iodide salt | 5 | 3 | 5 | 21.2 | 20.73 | 97.8 |
| I-8 | Propargyl ammonium iodide salt | Propargyl ammonium iodide salt | Propargyl ammonium iodide salt | 20 | 3 | 5 | 20.5 | 20.03 | 97.7 |
| I-9 | 1-(2-Pyridyl)-1H-pyrazole iodide salt | 1-(2-Pyridyl)-1H-pyrazole iodide salt | Propargyl ammonium iodide salt | 3 | 3 | 5 | 21.7 | 21.27 | 98.0 |
| I-10 | Pyrrolidinium iodide salt | Pyrrolidinium iodide salt | Propargyl ammonium iodide salt | 3 | 3 | 5 | 21.6 | 21.12 | 97.8 |
| I-11 | Tetrabutyl-ammonium iodide | Tetrabutyl-ammonium iodide | Propargyl ammonium iodide salt | 3 | 3 | 5 | 21.6 | 21.17 | 98.0 |
| I-12 | 2-chloro-triethylamine iodide salt | 2-chloro-triethylamine iodide salt | Propargyl ammonium iodide salt | 3 | 3 | 5 | 21.5 | 20.98 | 97.6 |
| I-13 | Propargyl ammonium iodide salt | Propargyl ammonium iodide salt | Propargyl ammonium iodide salt | 0.5 | 3 | 0 | 20.0 | 17.86 | 89.3 |
| I-14 | Propargyl ammonium iodide salt | Propargyl ammonium iodide salt | Propargyl ammonium iodide salt | 30 | 3 | 0 | 19.8 | 17.94 | 90.6 |
| Comparative Example 1 | Propargyl ammonium iodide salt | Propargyl ammonium iodide salt | Propargyl ammonium iodide salt | 0 | 0 | 0 | 19.4 | 14.39 | 74.2 |

The results in the foregoing table show that:

as compared with Comparative Example 1, in which a one-dimensional perovskite coating layer is not used for coverage, the energy conversion efficiency and cell stability of the solar cells obtained in Examples I-1 to I-14, in which a one-dimensional perovskite coating layer is used to cover the main perovskite layer, were significantly improved;

when the thickness of the one-dimensional perovskite coating layer (surface, primer, or peripheral thickness) is in a range of 1 nm to 20 nm, especially 2 nm to 5 nm, better energy conversion efficiency and cell stability are achieved; and as compared to Examples I-1 to I-5, in which only the surface and primer layers are coated, Examples I-6 to I-12, in which the surface, primer and peripheral layers of the main perovskite layer are fully coated, have achieved better energy conversion efficiency and cell stability. In addition, type of material of the coating layer has some impact on the final formed perovskite solar cell.

TABLE 2

Effect of HOMO energy level matching of second overlay layer (surface layer) on battery performance

| Example number | HOMO energy level of main perovskite layer (eV) | Primer layer thickness (nm) | Surface layer thickness (nm) | HOMO energy level of surface layer (eV) | HOMO energy level difference between surface layer and main perovskite layer (eV) | HOMO energy level of hole transport layer (eV) | HOMO energy level difference between one-dimensional surface layer and hole transport layer (eV) | Energy conversion efficiency (%) | Battery open voltage (V) |
|---|---|---|---|---|---|---|---|---|---|
| II-1 | −5.4 | 3 | 10 | −5.20 | 0.2 | −5.2 | 0.00 | 20.8 | 1.09 |
| II-2 | −5.4 | 3 | 5 | −5.30 | 0.1 | −5.2 | −0.10 | 21.0 | 1.11 |
| II-3 | −5.4 | 3 | 3 | −5.32 | 0.08 | −5.2 | −0.12 | 21.6 | 1.13 |
| II-4 | −5.4 | 3 | 30 | −5.00 | 0.4 | −5.2 | 0.20 | 19.8 | 0.95 |
| II-5 | −5.4 | 3 | 0.5 | −5.60 | −0.2 | −5.2 | −0.40 | 20.0 | 0.98 |

The results in the foregoing table show that:

the HOMO energy level of the surface layer (second overlay) of the one-dimensional perovskite coating layer is related to its thickness, a thicker surface layer brings larger HOMO energy level, and better energy conversion efficiency and cell opening voltage can be achieved when thickness of the surface layer is 1 nm to 20 nm and optionally 2 nm to 5 nm;

when the HOMO energy level of the surface layer (second overlay layer) of the one-dimensional perovskite coating layer is greater than or equal to the HOMO energy level of the main perovskite layer and the absolute value of the difference therebetween is in a range of 0 eV to 0.3 eV, optionally in a range of 0.05 eV to 0.1 eV, a better energy conversion efficiency and battery opening voltage can be achieved; and when the HOMO energy level of the hole transport layer is greater than or equal to the HOMO energy level of the surface layer (second overlay layer) of the one-dimensional perovskite coating layer and the absolute value of the difference therebetween is in a range of 0 eV to 0.3 eV, optionally in a range of 0 eV to 0.15 eV, a better energy conversion efficiency and battery opening voltage can be achieved.

The results in the foregoing table show that:

the LUMO energy level of the primer layer (first overlay) of the one-dimensional perovskite coating layer is related to its thickness, and larger thickness brings a smaller LUMO energy level;

the LUMO energy level of the primer layer (first overlay) of the one-dimensional perovskite coating layer is related to its material, a smaller molar ratio of the first overlay layer material to lead iodide brings a smaller LUMO energy level;

when the thickness of the one-dimensional perovskite coating layer is 1 nm to 20 nm and the molar ratio of the primer layer material to lead iodide is 1:1.0 to 1:1.2, a better energy conversion efficiency and cell opening voltage can be achieved;

when the LUMO energy level of the primer layer (first overlay layer) of the one-dimensional perovskite coating layer is greater than or less than, optionally less than the LUMO energy level of the main perovskite layer and the absolute value of the difference therebetween is in a range of 0 eV to 0.3 eV, optionally in a range of 0.05 eV to 0.25 eV, a better energy conversion efficiency and battery opening voltage is achieved; and

TABLE 3

Effect of LUMO energy level matching of first overlay layer (primer layer) on battery performance

| Example number | LUMO energy level of main perovskite layer (eV) | Molar ratio of primer layer overlay layer material and lead iodide | Primer layer thickness (nm) | Surface layer thickness (nm) | LUMO energy level of primer layer (eV) | LUMO energy level difference between primer layer and main perovskite layer | LUMO energy level of electron transport layer (eV) | LUMO energy level difference between first overlay layer and electron transport layer | Energy conversion efficiency (%) | Battery open voltage (V) |
|---|---|---|---|---|---|---|---|---|---|---|
| III-1 | −4.0 | 1:1.10 | 10 | 3 | −4.20 | −0.20 | −4.5 | 0.30 | 20.8 | 1.09 |
| III-2 | −4.0 | 1:1.10 | 5 | 3 | −4.10 | −0.10 | −4.5 | 0.40 | 21.0 | 1.11 |
| III-3 | −4.0 | 1:1.10 | 3 | 3 | −4.08 | −0.08 | −4.5 | 0.42 | 21.6 | 1.13 |
| III-4 | −4.0 | 1:1.20 | 3 | 3 | −4.25 | −0.25 | −4.5 | 0.25 | 20.6 | 1.08 |
| III-5 | −4.0 | 1:1.13 | 3 | 3 | −4.15 | −0.15 | −4.5 | 0.35 | 20.9 | 1.10 |
| III-6 | −4.0 | 1:1.00 | 3 | 3 | −3.95 | 0.05 | −4.5 | 0.55 | 20.4 | 1.06 |
| III-7 | −4.0 | 1:1.10 | 1 | 3 | −3.60 | 0.40 | −4.5 | 0.90 | 10.0 | 0.70 |
| III-8 | −4.0 | 1:0.85 | 3 | 3 | −3.65 | 0.35 | −4.5 | 0.85 | 10.5 | 0.72 |
| III-9 | −4.0 | 1:1.35 | 3 | 3 | −4.60 | −0.60 | −4.5 | −0.10 | 15.6 | 0.82 |

when the LUMO energy level of the electron transport layer is greater than or less than, optionally less than the LUMO energy level of the primer layer (second overlay layer) of the one-dimensional perovskite coating layer and the absolute value of the difference therebetween is in a range of 0 eV to 0.6 eV, optionally in a range of 0.3 eV to 0.5 eV, a better energy conversion efficiency and battery opening voltage is achieved.

It should be noted that this application is not limited to the foregoing embodiments. The foregoing embodiments are merely examples, and embodiments having substantially the same constructions and the same effects as the technical idea within the scope of the technical solutions of this application are all included in the technical scope of this application. In addition, without departing from the essence of this application, various modifications made to the embodiments that can be conceived by persons skilled in the art, and other manners constructed by combining some of the constituent elements in the embodiments are also included in the scope of this application.

The invention claimed is:

1. A perovskite solar cell structurally comprising a transparent electrode, an electron transport layer, a perovskite layer, a hole transport layer and a second electrode in sequence, wherein the perovskite layer comprises a main perovskite layer and a one-dimensional perovskite coating layer covering surface and periphery of the main perovskite layer, wherein the one-dimensional perovskite coating layer comprises:

a first overlay layer disposed between the main perovskite layer and the electron transport layer; and a second overlay layer disposed between the main perovskite layer and the hole transport layer, wherein an absolute value of a difference between LUMO energy level of the first overlay layer and LUMO energy level of the main perovskite layer is in a range of 0 eV to 0.3 eV.

2. The perovskite solar cell according to claim 1, wherein the one-dimensional perovskite coating layer further comprises a third overlay layer covering the periphery of the main perovskite layer.

3. The perovskite solar cell according to claim 2, wherein thicknesses of the first overlay layer, the second overlay layer, and the third overlay layer are each independently 1 nm to 20 nm.

4. The perovskite solar cell according to claim 1, wherein LUMO energy level of the first overlay layer is greater than or equal to LUMO energy level of the electron transport layer, and an absolute value of a difference between the LUMO energy level of the first overlay layer and the LUMO energy level of the electron transport layer is in a range of 0 eV to 0.6 eV.

5. The perovskite solar cell according to claim 1, wherein HOMO energy level of the second overlay layer is greater than or equal to HOMO energy level of the main perovskite layer, and an absolute value of a difference between the HOMO energy level of the second overlay layer and the HOMO energy level of the main perovskite layer is in a range of 0 eV to 0.3 eV.

6. The perovskite solar cell according to claim 1, wherein HOMO energy level of the second overlay layer is less than or equal to HOMO energy level of the hole transport layer, and an absolute value of a difference between the HOMO energy level of the second overlay layer and the HOMO energy level of the hole transport layer is in a range of 0 eV to 0.3 eV.

7. The perovskite solar cell according to claim 1, wherein overlay layer materials of the first overlay layer, the second overlay layer, and the third overlay layer are each independently selected from halogen salts of at least one of the following substances or derivatives thereof:

1-(2-pyridyl)-1H-pyrazole, pyrrolidine iodide, propargyl ammonium cation, tetrabutylammonium cation, or 2-chlorotriethylammonium cation.

8. The perovskite solar cell according to claim 1, wherein one of the first overlay layer and the second overlay layer is formed by the overlay layer material and a halogenated metal salt, and optionally, molar ratio of the overlay layer material and the halogenated metal salt is in a range of 1:0.9 to 1:1.3.

9. The perovskite solar cell according to claim 8, wherein the halogenated metal salt is selected from at least one of lead iodide, lead bromide, or lead chloride.

10. An electric apparatus, comprising the perovskite solar cell according to claim 1.

11. A fabrication method of perovskite solar cell, comprising a step of fabricating or preparing a transparent electrode, a step of fabricating an electron transport layer, a step of fabricating a perovskite layer, a step of fabricating a hole transport layer, and a step of fabricating a second electrode, wherein the perovskite layer comprises a main perovskite layer and a one-dimensional perovskite coating layer covering surface and periphery of the main perovskite layer, wherein the one-dimensional perovskite coating layer comprises:

a first overlay layer disposed between the main perovskite layer and the electron transport layer; and a second overlay layer disposed between the main perovskite layer and the hole transport layer, wherein an absolute value of a difference between LUMO energy level of the first overlay layer and LUMO energy level of the main perovskite layer is in a range of 0 eV to 0.3 eV.

12. The fabrication method of perovskite solar cell according to claim 11, wherein the step of fabricating the perovskite layer comprises the following operations:

(1) applying an overlay layer material and a halogenated metal salt to the electron transport layer or the hole transport layer to obtain a primer overlay layer, (2) applying a material for fabricating the main perovskite to the primer overlay layer to obtain the main perovskite layer, and (3) applying an overlay layer material to the main perovskite layer to obtain a surface overlay layer, wherein either one of the primer overlay layer and the surface overlay layer is a first overlay layer and the other one is a second overlay layer.

13. The fabrication method of perovskite solar cell according to claim 12, further comprising a step of fabricating a third overlay layer covering the periphery of the main perovskite layer, wherein the step specifically comprises the following operations:

(4) applying a protective layer material to the surface overlay layer to obtain a protective layer, (5) adding a solution of a coating layer material to the protective layer, making the solution flow to around the main perovskite layer and the protective layer to cover the entire periphery, and performing heating, to obtain a periphery overlay layer as a third overlay layer, and (6) removing the protective layer.

14. The fabrication method of perovskite solar cell according to claim 13, wherein the overlay layer materials in (1), (3), and (5) are each independently selected from halogen salts of at least one of the following substances or derivatives thereof:

1-(2-pyridyl)-1H-pyrazole, pyrrolidine iodide, propargyl ammonium cation, tetrabutylammonium cation, or 2-chlorotriethylammonium cation.

15. The fabrication method of perovskite solar cell according to claim 12, wherein in (1), a molar ratio of the overlay layer material and the halogenated metal salt is in a range of 1:0.9 to 1:1.3.

16. The fabrication method of perovskite solar cell according to claim 12, wherein the halogenated metal salt is selected from at least one of lead iodide, lead bromide, or lead chloride.

17. The fabrication method of perovskite solar cell according to claim 13, wherein the application is carried out by spin-coating, co-evaporation or evaporation, and optionally, in (4), the application is carried out by spin-coating, and heating is performed after the spin-coating is complete, so as to obtain the protective layer.

18. The fabrication method of perovskite solar cell according to claim 13, wherein in (6), a solvent is used to dissolve the protective layer, and optionally, the solvent for dissolving the protective layer is trifluoroethanol; and then the protective layer and substances on the protective layer are shaken off by spinning.

19. The fabrication method of perovskite solar cell according to claim 13, wherein the protective layer material is lead pyridine-2-carboxylate.

* * * * *